(12) United States Patent  (10) Patent No.: US 7,667,313 B2
Kawabata et al.  (45) Date of Patent: Feb. 23, 2010

(54) STACKED SEMICONDUCTOR MODULE (75) Inventors: Takeshi Kawabata, Osaka (JP);
Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 287 days.

(21) Appl. No.: 11/491,033

(22) Filed: Jul. 24, 2006

(65) Prior Publication Data
US 2007/0096334 A1 May 3, 2007

(30) Foreign Application Priority Data
Oct. 27, 2005 (JP) ............... 2005-313186

(51) Int. Cl.
*H01L 23/02* (2006.01)
(52) U.S. Cl. ............... 257/686; 257/777
(58) Field of Classification Search ............... 257/686, 257/777, 778, 723, 724, 782, 783
See application file for complete search history.

(56) References Cited

U.S. PATENT DOCUMENTS

| | | | | |
|---|---|---|---|---|
| 6,025,648 | A * | 2/2000 | Takahashi et al. | 257/778 |
| 7,180,165 | B2 * | 2/2007 | Ellsberry et al. | 257/686 |
| 7,184,276 | B2 * | 2/2007 | Hashimoto | 361/803 |
| 7,265,442 | B2 * | 9/2007 | Henttonen | 257/686 |
| 7,332,800 | B2 * | 2/2008 | Kikuchi et al. | 257/686 |
| 7,345,561 | B2 * | 3/2008 | Meyer et al. | 336/61 |
| 7,365,416 | B2 * | 4/2008 | Kawabata et al. | 257/686 |
| 7,408,255 | B2 * | 8/2008 | Corisis et al. | 257/686 |
| 2001/0028114 | A1* | 10/2001 | Hosomi | 257/778 |
| 2002/0163075 | A1* | 11/2002 | Ho et al. | 257/712 |
| 2004/0222508 | A1 | 11/2004 | Aoyagi | |
| 2005/0006784 | A1 | 1/2005 | Nakayama | |
| 2005/0110166 | A1 | 5/2005 | Aoyagi | |
| 2005/0146049 | A1* | 7/2005 | Kripesh et al. | 257/776 |
| 2006/0175696 | A1* | 8/2006 | Kim | 257/686 |

FOREIGN PATENT DOCUMENTS

| | | |
|---|---|---|
| CN | 1532930 | 9/2004 |
| JP | 09-289264 | 11/1997 |

(Continued)

OTHER PUBLICATIONS

Chinese Office Action, with English translation, issued in Chinese Patent Application No. CN 200610108604.3, mailed Jan. 9, 2009.

(Continued)

*Primary Examiner*—S. V Clark
(74) *Attorney, Agent, or Firm*—McDermott Will & Emery LLP (57) ABSTRACT

A stacked semiconductor module is made by stacking a second semiconductor device having a second semiconductor chip mounted to the top surface of a second semiconductor substrate above the top surface of a first semiconductor device having a first semiconductor chip mounted to a first semiconductor substrate. The top surface of the first semiconductor substrate is provided with a first connection terminal and the bottom surface of the first semiconductor substrate is provided with an external connection terminal. A region of the bottom surface of the second semiconductor substrate lying opposite to the second semiconductor chip is provided with a second connection terminal. A conductive connecting member connects the first connection terminal to the second connection terminal.

9 Claims, 5 Drawing Sheets

FOREIGN PATENT DOCUMENTS

| | | |
|---|---|---|
| JP | 2001-319995 | 11/2001 |
| JP | 2004-281633 | 10/2004 |
| JP | 2004-281919 | 10/2004 |
| JP | 2004-281921 | 10/2004 |
| JP | 2004-363126 | 12/2004 |
| JP | 2004-363351 | 12/2004 |
| JP | 2006-005053 | 1/2006 |

OTHER PUBLICATIONS

Japanese Notice of Reasons for Rejection, w/ English translation thereof, issued in Japanese Patent Application No. JP 2005-313186 dated Nov. 17, 2009.

* cited by examiner

STACKED SEMICONDUCTOR MODULE

CROSS-REFERENCE TO RELATED APPLICATIONS

This application claims priority under 35 U.S.C. §119 on Patent Application No. 2005-313186 filed in Japan on Oct. 27, 2005, the entire contents of which are hereby incorporated by reference.

BACKGROUND OF THE INVENTION (a) Fields of the Invention

The present invention relates to the structure of a stacked semiconductor module three-dimensionally constructed by stacking a second semiconductor device above a first semiconductor device. In particular, the present invention relates to the mount structure of the module.

(b) Description of Related Art

With a demand for size reduction and functionality enhancement of electronic equipment of various types including a cellular phone and a digital camera, attention is being given to a stacked semiconductor module which is made by stacking semiconductor devices each of which has electronic components, particularly, one or more semiconductor chips mounted to a semiconductor substrate.

In the stacked semiconductor module, stacking of semiconductor devices can significantly reduce the footprint thereof on a circuit substrate. Furthermore, the module employs only semiconductor chips which have been subjected, before mounting to a semiconductor substrate, to inspections up to and including a burn-in test and then recognized as conforming chips, so that the reliability as a module can be insured more certainly.

The method in which semiconductor chips are mounted to a semiconductor substrate formed with interconnects, however, tends to cause bowing of the semiconductor substrate in mounting the semiconductor chips to the semiconductor substrate, which degrades the reliability of connection between the stacked semiconductor devices. In addition, for this method, it is difficult to mount chips of different types.

To solve such a problem, a module structure as a first conventional example (see, for example, Japanese Unexamined Patent Publication No. 2004-281919) is shown which includes: a first semiconductor substrate; a first semiconductor chip mounted to the first semiconductor substrate; a second semiconductor substrate; a second semiconductor chip mounted to the second semiconductor substrate; protruding electrodes for connecting the first and second semiconductor substrates so that the second semiconductor substrate is held just above the first semiconductor chip; and a sealing material for sealing the second semiconductor chip so that the arrangement area of the protruding electrodes is also contained in the sealed region.

With this structure, the sealing material with the second semiconductor chip sealed therein can reinforce the arrangement area of the protruding electrodes in the second semiconductor substrate and suppress an increase in the height of the stacked semiconductor module in mounting the second semiconductor substrate to the first semiconductor substrate. Moreover, bowing of the second semiconductor substrate to which the second semiconductor chip is mounted can be reduced. Therefore, the semiconductor module made by stacking the semiconductor devices in the manner described above can prevent degradation of the reliability of connection between the first and second semiconductor substrates, and concurrently save the mounting space of the semiconductor chips.

As a second conventional example, a stacked module structure (see, for example, Japanese Unexamined Patent Publication No. 2004-281633) is shown which is made by staking a plurality of semiconductor chips. In each of the semiconductor chips in this structure, the top surface thereof perpendicular to the stacking direction is provided with a mounting terminal for use in mounting and an inspection terminal for inspecting the quality thereof, and the bottom surface thereof perpendicular to the stacking direction is provided with a mounting pad connected to a mounting terminal of adjacent semiconductor chip and an inspection pad electrically continuous with its own inspection terminal.

In the stacked module thus constructed, to an inspection pad of a semiconductor chip having been already mounted, an inspection terminal of another semiconductor chip to be stacked is joined to receive an inspection signal from the joined inspection terminal electrically continuous with the inspection pad of the mounted semiconductor chip, thereby carrying out an inspection. If the result of the inspection is acceptable, the inspected semiconductor chip to be stacked is moved onto the plane flush with the mounted semiconductor chip, that is, moved on the plane perpendicular to the stacking direction and in parallel with the substrate. Then, the mounting terminal of the semiconductor chip to be mounted is connected to the mounting pad of the mounted semiconductor chip to stack these chips.

With this procedure, the quality inspection of the individual semiconductor chips to be stacked can be carried out easily before stacking of the respective chips. Moreover, since the semiconductor chips to be stacked do not have to be mounted to the semiconductor substrate, the total dimension of the module can be decreased. Furthermore, since a series of steps for mounting the semiconductor chips to the semiconductor substrate are eliminated, time and labor necessary for fabrication of the module can be reduced and yield of the stacked module can be improved.

In the first conventional example, the protruding electrodes (solder ball bumps) for connecting the second and first semiconductor devices are connected in a region of the back side of the second semiconductor substrate lying outside the semiconductor chip mounting region, that is, in a region corresponding to the arrangement region of the sealing material. From this structure, if the semiconductor chip is large in dimension or a plurality of semiconductor chips are mounted, the shape of the second semiconductor substrate, eventually, the shape of the first semiconductor substrate is also large. This results in arrangement of the solder ball bumps on a wide area. Consequently, faulty connection portions are created easily in applying an impact from outside, thermal stress, or the like. As a result, the semiconductor devices in the first conventional example are likely to offer a degraded reliability.

In the second conventional example, the module has the structure in which the semiconductor chips are stacked directly on the semiconductor substrate and further the respective semiconductor chips are needed to be provided with vias. From this structure, when comparison is made with a conventional semiconductor chip, the chip in this example has a greater chip area. Moreover, this example requires an etching process for forming a via in the semiconductor chip, which makes the fabrication process of the semiconductor chip complicated. These problems lead to an increased cost of the semiconductor chip. In addition, it is relatively difficult to conduct a burn-in test on the semiconductor chip before stacking to sufficiently check the reliability thereof.

SUMMARY OF THE INVENTION

In order to solve the above problems, an object of the present invention is to provide a stacked semiconductor module in which the respective reliabilities of semiconductor devices to be stacked can be checked and in which poor connection is difficult to cause even in applying load such as external load or thermal stress during and after stacking, thereby offering a high reliability thereof.

A stacked semiconductor module according to the present invention is directed for a stacked semiconductor module made by stacking a second semiconductor device above a first semiconductor device, the second semiconductor device having a second semiconductor chip mounted to the top surface of a second semiconductor substrate, the first semiconductor device having a first semiconductor chip mounted to a first semiconductor substrate. The top surface of the first semiconductor substrate is provided with a first connection terminal and the bottom surface of the first semiconductor substrate is provided with an external connection terminal. A region of the bottom surface of the second semiconductor substrate lying opposite to the second semiconductor chip is provided with a second connection terminal. A conductive connecting member connects the first connection terminal to the second connection terminal.

With this structure, the second connection terminal is provided in a region of the bottom surface of the second semiconductor substrate lying opposite to a region where the second semiconductor chip is mounted. Therefore, when the conductive connecting member connects the second connection terminal to the first connection terminal of the first semiconductor substrate, the property of the second semiconductor chip as a rigid body can suppress the occurrence of bowing in the second semiconductor substrate, and further in the stacked semiconductor module.

Preferably, in the stacked semiconductor module according to the present invention, the first semiconductor chip is mounted to the center portion of the first semiconductor substrate, and the second semiconductor chip is mounted to the center portion of the second semiconductor substrate.

As shown above, the first semiconductor chip is disposed in and mounted to the center region of the top surface of the first semiconductor substrate formed with the first connection terminal. With this structure, external-connection protruding electrodes can be arranged in a grid array pattern over the entire surface of the first semiconductor substrate, which widen the pitch of arrangement of the external-connection protruding electrodes. Moreover, when the first semiconductor chip is disposed in the center region of the bottom surface of the first semiconductor substrate provided with the external-connection protruding electrode, no first semiconductor chip is present on the surface of the first semiconductor substrate where the first connection terminal is formed. Therefore, the flexibility in the arrangement of the first connection terminal for connecting the second connection terminal is improved. Furthermore, when the second semiconductor chip is provided in the center region of the second semiconductor substrate, the second connection terminal is also provided in this region. That is to say, the region formed with the second connection terminal has the semiconductor chip mounted to the surface lying opposite thereto relative to the semiconductor substrate, and it is located in the center region of the second semiconductor substrate. Thus, even if load such as external load or thermal stress is applied, stress applied to the connection portion becomes small. This suppresses the occurrence of poor connection and greatly improves the reliability of connection.

Preferably, in the stacked semiconductor module according to the present invention, a region where the second semiconductor chip is mounted is larger than a region where the first semiconductor chip is mounted.

This increases the mounting region of the second semiconductor chip as a rigid body, whereby the flexibility of arrangement of the second connection terminal can be enhanced and a great number of second connection terminals can be disposed.

Preferably, in the stacked semiconductor module according to the present invention, the second semiconductor chip is composed of a plurality of semiconductor chips arranged on the same plane, and preferably the second semiconductor chip is composed of a plurality of semiconductor chips in a stacked arrangement. In the case like this where the second semiconductor chip is composed of a plurality of semiconductor chips, the second semiconductor chip may be mounted to the second semiconductor substrate by at least one of a flip chip technique, a wire bonding technique, and a TAB (Tape Automated Bonding) technique, or by a combination of at least two of the listed techniques.

With such a mounting technique, for example, if the semiconductor chip is mounted by a flip chip technique using a bump on the second semiconductor substrate, a transmission line at a low impedance can be obtained. Alternatively, for example, if mounting is made by a wire bonding technique, the interconnection pattern of the second semiconductor substrate can be simplified and a mounting apparatus for general purpose use can be employed. Therefore, a stacked semiconductor module with a high yield and a low cost can be provided. Still alternatively, if a semiconductor chip is mounted by a TAB technique, not only three-dimensional interconnection can be established easily, but also mounting in combination with a flip chip technique, a wire bonding technique, and the like can be done easily. If a combination of two of a flip chip technique, a wire bonding technique, and a TAB technique is used as the mounting technique of the semiconductor chip, the semiconductor chip can be mounted to a narrow region at a high density.

In the stacked semiconductor module according to the present invention, resin for adhering and sealing the second semiconductor device and the second semiconductor chip may be provided therein.

With this structure, in the region where the second semiconductor chip covered with the resin is mounted, the rigidity of the resin is added to the rigidity of the semiconductor chip. Therefore, when the conductive connecting member connects the second connection terminal to the first connection terminal of the first semiconductor substrate, the occurrence of bowing can be further suppressed. For example, when the second semiconductor chip is mounted by a wire bonding technique, protecting resin is provided even to cover wires. This further adds the rigidity of the protecting resin to the chip. Although the second connection terminals are provided in the mounting region of the opposed second semiconductor chip, part of the second connection terminals may be provided in the region provided with the resin for adhering and sealing the second semiconductor chip to the second semiconductor device. If the second semiconductor chip is mounted by a flip chip technique, fillets of resin may be formed positively.

In the stacked semiconductor module according to the present invention, the second connection terminals may be arranged in a grid array pattern in the region corresponding to the perimeter region of the second semiconductor chip, and connected by the conductive connecting members to the first connection terminals arranged likewise in a grid array pattern, respectively. The conductive connecting members connecting the terminals can have any shape such as a globular body, a columnar body, a hemispheric body, or a bell-shaped body, and their material may be a substance with conductivity or a bump.

With this structure, a compact, slim stacked semiconductor module in a high-density stacked arrangement can be fabricated. By thus connecting the first semiconductor device to the second semiconductor device, semiconductor devices made of different types of packages can be stacked.

In the stacked semiconductor module according to the present invention, the external-connection protruding electrode of the first semiconductor device may be made of a conductive ball, a columnar body, or a plated bump or a wire bump formed on the surface of the external connection terminal of the first semiconductor device, and arranged on the first semiconductor substrate in a grid array pattern.

With this structure, the module can be connected with good reliability to a circuit board of electronic equipment, and in addition the area occupied on the circuit board can be reduced. Therefore, a more compact, slim circuit board with a higher functionality can be provided.

In the stacked semiconductor module according to the present invention, the first and second semiconductor substrates may have the same dimension, and another electronic component may be mounted to the surface of the second semiconductor substrate to which the second semiconductor chip is mounted.

With this structure, not only the mounting region of the semiconductor chip to be mounted to the second semiconductor substrate can be secured sufficiently, but also electronic components such as resistances, capacitors, and inductors can be arranged in the vicinity of the second semiconductor chip. Thereby, electrical noise of the second semiconductor chip can be suppressed more effectively. By thus mounting electronic components on the second semiconductor substrate, the necessity to mount these electronic components onto the circuit board is eliminated, and a circuit board with a higher functionality can be provided.

In the stacked semiconductor module according to the present invention, the base materials for the first and second semiconductor substrates may be made of one selected from glass epoxy resin, polyimide resin, aramid resin, alumina ceramic, aluminum nitride ceramic, glass, quartz, or the like.

With this structure, by forming the first and second semiconductor substrates using the same material, the two substrates can have the same thermal expansion coefficient to greatly reduce influences due to thermal stress. Therefore, a highly-reliable stacked semiconductor module can be fabricated.

DETAILED DESCRIPTION OF THE PREFERRED EMBODIMENTS

Hereinafter, embodiments of the present invention will be described with reference to the accompanying drawings. However, the present invention is not limited to the following embodiments. For convenience of drawing creation, the thickness, length, and other proportions of components on the drawings differ from those of the actual components. Also, electrodes of a semiconductor chip and connection terminals, inner layer interconnects, and surface interconnects of a semiconductor substrate differ in number and shape from the actual components, and the numbers and shapes easy to illustrate are used in the drawings. In the flowing embodiments, the description of the identical components is omitted in some cases.

First Embodiment

Figure 1:
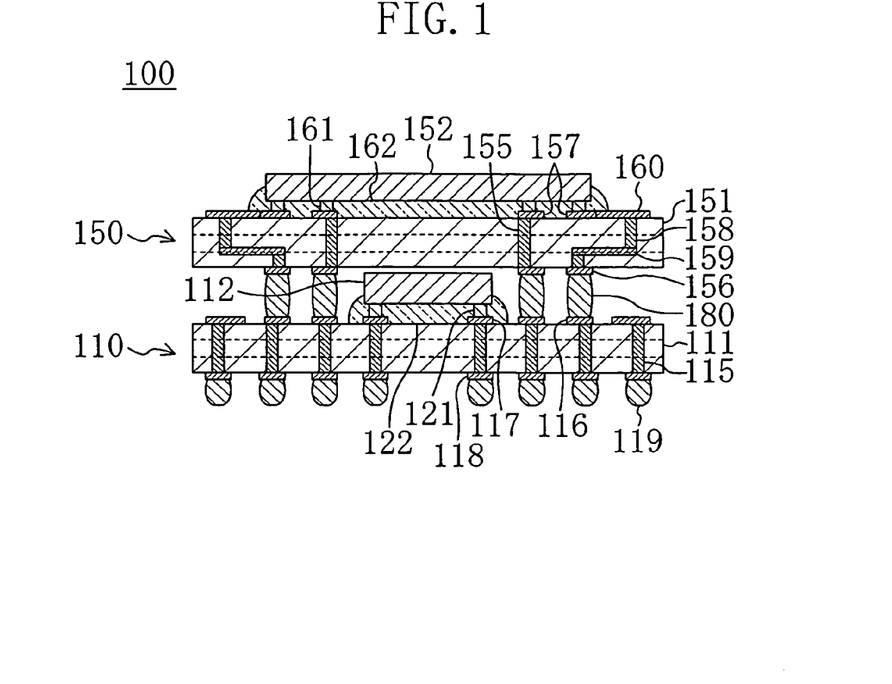
FIG. 1 is a sectional view of a stacked semiconductor module according to a first embodiment.
Figure 2:
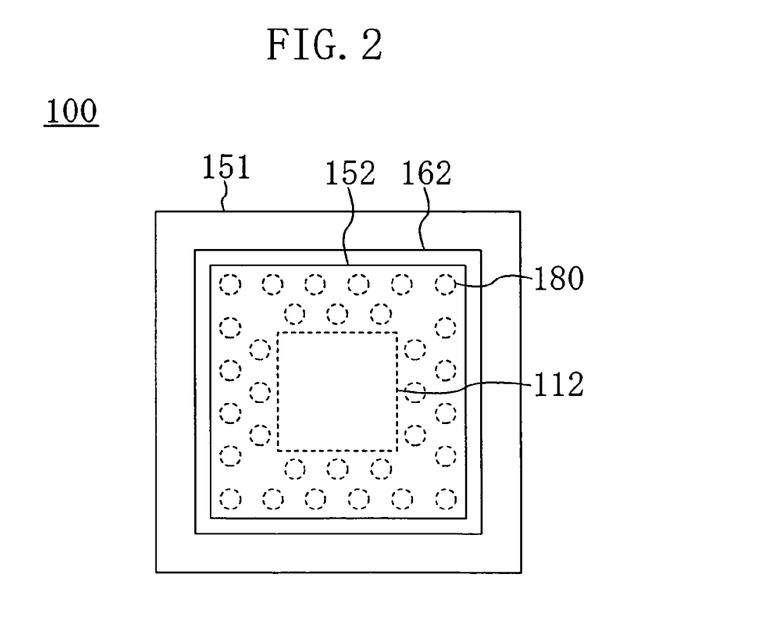
FIG. 2 is a plan view of the stacked semiconductor module of the first embodiment as viewed from a second semiconductor device.

FIG. 1 shows a cross-sectional structure of a stacked semiconductor module 100 according to a first embodiment of the present invention, and FIG. 2 shows a plan structure of the stacked semiconductor module 100.

The stacked semiconductor module 100 is designed so that a second semiconductor device 150 with a second semiconductor chip 152 mounted to the top surface of a second semiconductor substrate 151 is stacked above a first semiconductor device 110 with a first semiconductor chip 112 mounted to a first semiconductor substrate 111.

In the first semiconductor substrate 111 having a multilayer interconnection structure, the center portion of the top surface thereof is provided with a region where the first semiconductor chip 112 is disposed. The inside of the first semiconductor substrate 111 is provided with a plurality of through conductors 115 extending from the top surface to the bottom surface. The top surface of the first semiconductor substrate 111 is provided with first connection terminals 116 for making connection to the second semiconductor device 150 and chip connection terminals 117 for making connection to the first semiconductor chip 112, and the first connection terminals 116 and the chip connection terminals 117 are connected to the top ends of the corresponding through conductors 115. The first connection terminals 116 are arranged in a grid array pattern in a region surrounding the first semiconductor chip 112. The bottom surface of the first semiconductor substrate 111 is provided with external connection terminals 118 in a grid array pattern, and the external connection terminals 118 are connected to the bottom ends of the corresponding through conductors 115. The bottom surfaces of the external connection terminals 118 are provided with external-connection protruding electrodes 119 for connecting the stacked semiconductor module 100 to a circuit board (not shown). Although the term "a grid array pattern" means the matrix arrangement as copied from a BGA (Ball Grid Array)

that is a kind of surface mount type package, the term in this description means the arrangement composed of a plurality of lines arranged on a plane.

Note that the first connection terminals 116 and the chip connection terminals 117 provided on the top surface of the first semiconductor substrate 111 and the external connection terminals 118 provided on the bottom surface thereof may be connected by, instead of the through conductors 115, an interconnection pattern made of, for example, inner vias (not shown), inner interconnects (not shown), and surface interconnects (not shown) formed on the top and bottom surfaces of the first semiconductor substrate 111.

Alternatively, although not shown, the interconnection pattern made of the first connection terminals 116, the chip connection terminals 117, and the external connection terminals 118 may be an interconnection pattern in which the first connection terminals 116 are connected at the midpoint of the pattern, that is, in which connection is made in series in the order of the chip connection terminal 117, the first connection terminal 116, and the external connection terminal 118. With this pattern, the first connection terminal 116 can be checked for faulty electrical continuity simultaneously with an electrical test on the first semiconductor device 110, so that only the first semiconductor device 110 recognized as a conforming one can be stacked. As a result, a module with a stacked structure can be provided at a high yield.

As the base material for the first semiconductor substrate 111, use can be made of glass epoxy resin, polyimide resin, aramid resin, alumina ceramic, aluminum nitride ceramic, glass, quartz, or the like. However, the base material of resin is preferably used in that the resulting multilayer interconnection structure can be fabricated at a low cost.

The external-connection protruding electrodes 119 are each made of a ball-shaped or columnar conductor, or a plated bump or a wire bump formed on the surface of the external connection terminal 118, and are disposed on the external connection terminals 118, respectively, provided on the first semiconductor substrate 111 in a grid array pattern. In the case of the plated bump, it may have the shape of a polygonal prism, a frustum of a pyramid, a frustum of a cone, or the like. In the case of the ball-shaped conductor, for example, a tin (Sn)-based solder ball may be fixedly bonded by flux onto the external connection terminal 118 of the first semiconductor substrate 111 and then the bonded ball may be connected to the external connection terminal 118 at the same time as the connection to the circuit board (not shown). Note that a conductive resin ball may be employed instead of a tin-based solder ball.

On electrode terminals (not shown) arranged on the perimeter of the surface of the first semiconductor chip 112 where circuitry is formed, chip-connection protruding electrodes 121 are provided which are used for flip chip bonding to the chip connection terminals 117 of the first semiconductor substrate 111. Note that the first semiconductor chip 112 is made from a single-crystal silicon substrate, has circuitry formed by a known method, and is thinned by polishing before mounting. However, depending on the module structure, it may be used without polishing, or may be made from not a single-crystal silicon substrate but a compound semiconductor substrate, an SOI substrate, or the like.

The first semiconductor chip 112 and the first semiconductor substrate 111 are adhered and sealed with resin 122 filling a gap therebetween. As the material for the resin 122, use can be made of, for example, a non-conductive film (NCF), an anisotropic conductive film (ACF), or liquid resin. In the case of using liquid resin, it may be applied for filling after connection between the chip-connection protruding electrode 121 and the chip connection terminal 117. The anisotropic conductive film (ACF) can electrically connect the chip-connection protruding electrode 121 and the chip connection terminal 117 of the first semiconductor substrate 111.

Like the first semiconductor substrate 111, the second semiconductor substrate 151 has a multilayer interconnection structure, the top surface thereof is provided with a region where the second semiconductor chip 152 is disposed, and the inside thereof is provided with a plurality of through conductors 155 extending from the top surface to the bottom surface. The bottom surface of the second semiconductor substrate 151 is provided with second connection terminals 156 for making connection to the first semiconductor device 110, while the top surface thereof is provided with chip connection terminals 157 for making connection to the second semiconductor chip 152. The second connection terminal 156 and the chip connection terminal 157 are connected to the bottom and top ends of the through conductor 155, respectively. The second connection terminals 156 are provided in a region of the bottom surface of the second semiconductor substrate 151 lying, relative to the second semiconductor substrate 151, opposite to the region to which the second semiconductor chip 152 is mounted, and arranged in a grid array pattern in a region on the substrate corresponding to the perimeter region of the second semiconductor chip 152. That is to say, in the second semiconductor device 150, the second connection terminal 156 is provided in the region where the second semiconductor chip 152 is mounted so that the second semiconductor substrate 151 is interposed therebetween.

Note that the second connection terminals 156 provided on the bottom surface of the second semiconductor substrate 151 and the chip connection terminals 157 provided on the top surface thereof may be connected by, instead of the through conductors 155, an interconnection pattern made of, for example, inner vias 158, inner interconnects 159, and surface interconnects 160 formed on the top and bottom surfaces of the second semiconductor substrate 151.

As the base material for the second semiconductor substrate 151, preferable use is made of the same base material as the first semiconductor substrate 111. By forming the semiconductor substrates using the same base material, the two substrates can have the same thermal expansion coefficient to minimize thermal stress applied thereto. This greatly improves the reliability as the semiconductor device.

In the first embodiment, the second semiconductor chip 152 has a greater mounting area than the first semiconductor chip 112. On electrode terminals (not shown) arranged on the perimeter of circuitry on the bottom surface of the second semiconductor chip 152, chip-connection protruding electrodes 161 are provided which are used for flip chip bonding to the chip connection terminals 157 of the second semiconductor substrate 151. The method for mounting the second semiconductor chip 152 to the second semiconductor substrate 151 and the method for fabricating the second semiconductor chip 152 are identical to those of the first semiconductor chip 112.

The second semiconductor chip 152 and the second semiconductor substrate 151 are adhered and sealed with resin 162 filling a gap therebetween. The material for the resin is the same as the material used for the first semiconductor chip 112.

Using the components described above, the first semiconductor device 110 is fabricated as follows. To the chip connection terminal 117 of the first semiconductor substrate 111, the first semiconductor chip 112 is connected by the chip-connection protruding electrode 121. Resin 122 is injected into a gap between the first semiconductor substrate 111 and the first semiconductor chip 112, and then pressurization under heating is performed for adhesion and sealing. Subsequently, the external-connection protruding electrode 119 is provided on the surface of the external connection terminal 118 of the first semiconductor substrate 111. In such a manner, the first semiconductor device 110 can be fabricated. In the case where an anisotropic conductive film (ACF) is used as the resin 122, the anisotropic conductive film is adhered to the formation region of the chip connection terminal 117 on the first semiconductor substrate 111, alignment of the first semiconductor chip 112 is then done, and pressurization under heating is performed. Thereby, even connection and sealing can be made simultaneously. Note that the fabrication method of the second semiconductor device 150 is similar to the fabrication method of the first semiconductor device 110 other than formation of the external connection terminal 118 and the external-connection protruding electrode 119.

In the first semiconductor device 110 fabricated in this manner, the surface having the first connection terminal 116 formed thereon is faced to the surface of the second semiconductor device 150 having the second connection terminal 156 formed thereon, and a conductive connecting member 180 connects the first connection terminal 116 to the second connection terminal 156. Thereby, the stacked semiconductor module 100 is constructed.

The conductive connecting member 180 is made of a columnar body having conductivity in the first embodiment. However, the member is not limited to having a columnar shape, and it may have the shape of a polygonal prism, a frustum of a pyramid, a frustum of a cone, or the like. Instead of the conductive columnar body, use may be made of a conductive ball such as a tin-based solder ball or a resin ball. If a conductive resin ball is used as the conductive connecting member 180, conductive adhesive or the like fixes the conductive resin ball in advance onto the first connection terminal 116, alignment of the second connection terminal 156 is done, and then the conductive adhesive is cured to connect the first semiconductor device 110 to the second semiconductor device 150. Note that as the conductive connecting member 180, use can be made of a solder ball other than a columnar body having conductivity and a conductive ball. If a solder ball is used, the solder ball can be heated and melted to connect the first semiconductor device 110 to the second semiconductor device 150 by solder.

In the stacked semiconductor module 100 structured in the manner described above, the second connection terminal 156 of the second semiconductor device 150 is provided on the region of the bottom surface of the second semiconductor substrate 151 lying, relative to the second semiconductor substrate 151, opposite to the region where the second semiconductor chip 152 is mounted. With this structure, the conductive connecting member 180 connected to the second connection terminal 156 and the first connection terminal 116 connected to the conductive connecting member 180 are also disposed in the region where the second semiconductor chip 152 is mounted. Further, the region where the second semiconductor chip 152 is mounted is located at the center portion of the second semiconductor substrate 151, so that the portion connecting the first semiconductor device 110 to the second semiconductor device 150 is also located at the center region. This prevents bowing of the second semiconductor substrate 151, and thereby makes it difficult to cause, in connecting the first connection terminal 116 by the conductive connecting member 180, poor connection therebetween resulting from the bowing. Moreover, even if the stacked semiconductor module 100 thermally deforms due to temperature fluctuation, thermal stress applied to the connection portion in the central region can be made small. This enables significant improvement of the reliability as the stacked semiconductor module 100.

Furthermore, in the first semiconductor device 110 and the second semiconductor device 150 constituting the stacked semiconductor module 100, mounting of the first semiconductor chip 112 and the second semiconductor chip 152 to the respective substrate is done by a flip chip technique, so that a compact, slim stacked semiconductor module 100 can be fabricated.

The stacked semiconductor module 100 according to the first embodiment is used, for example, for a control IC for controlling a memory by the first semiconductor chip 112, and it is suitable for a memory module in which the second semiconductor chip 152 is a memory. The first semiconductor chip 112 may be a DSP instead of the control IC. Alternatively, the module in this embodiment is also usable as an imaging module in which a DSP is employed for the first semiconductor chip 112 and an imaging element is employed for the second semiconductor chip 152. By thus stacking the semiconductor devices, the module of the first embodiment can be applied to various types of modules requiring compact and slim design.

Figure 3:
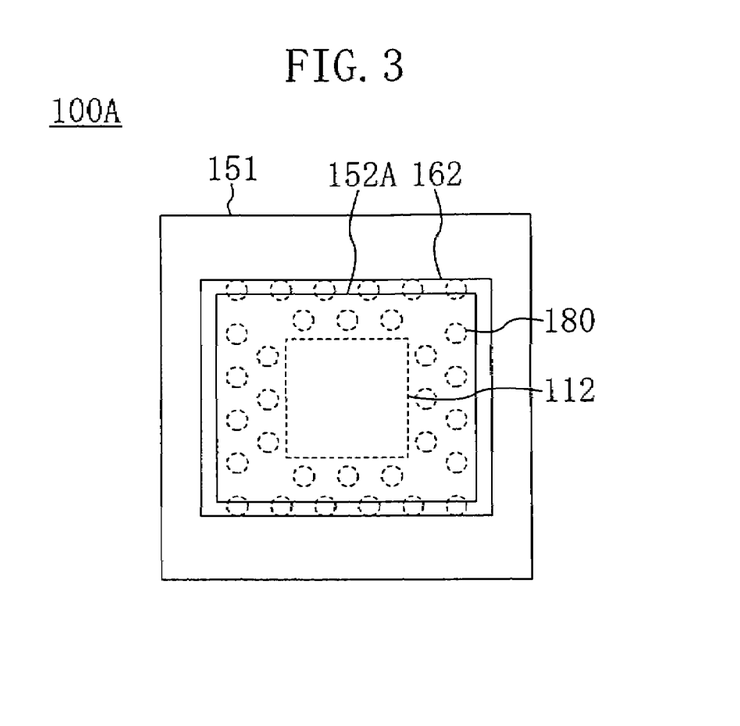
FIG. 3 is a plan view of a stacked semiconductor module according to a first modification of the first embodiment.

In the first embodiment, the second semiconductor chip 152 is set to be square as shown in FIG. 2. However, the present invention is not limited to such a shape, and, for example, it may be rectangular as shown FIG. 3. FIG. 3 shows a plan structure of a stacked semiconductor module 100A according to a first modification of the first embodiment.

In the stacked semiconductor module 100A, a second semiconductor chip 152A of the second semiconductor device 150 is rectangular. Following this, part of the chip connection terminals (not shown) on the second semiconductor substrate 151 differs in arrangement position from those of the stacked semiconductor module 100 shown in FIGS. 1 and 2, which results in different arrangement positions of the conductive connecting members 180 and the first connection terminals 116 from those of the stacked semiconductor module 100. However, other than these, the module 100A has the same structure as the stacked semiconductor module 100. As shown in FIG. 3, in the stacked semiconductor module 100A, the conductive connecting members 180 are provided not only in the region where the second semiconductor chip 152A is mounted but also in the region lying opposite to the region formed with the resin 162. Even if, like this, part of the arrangement region of the conductive connecting members 180 connecting the first and second semiconductor devices 110 and 150 is formed in the region lying opposite to the resin 162 relative to the second semiconductor substrate 151, the same effects as the stacked semiconductor module 100 can be offered.

Figure 4:
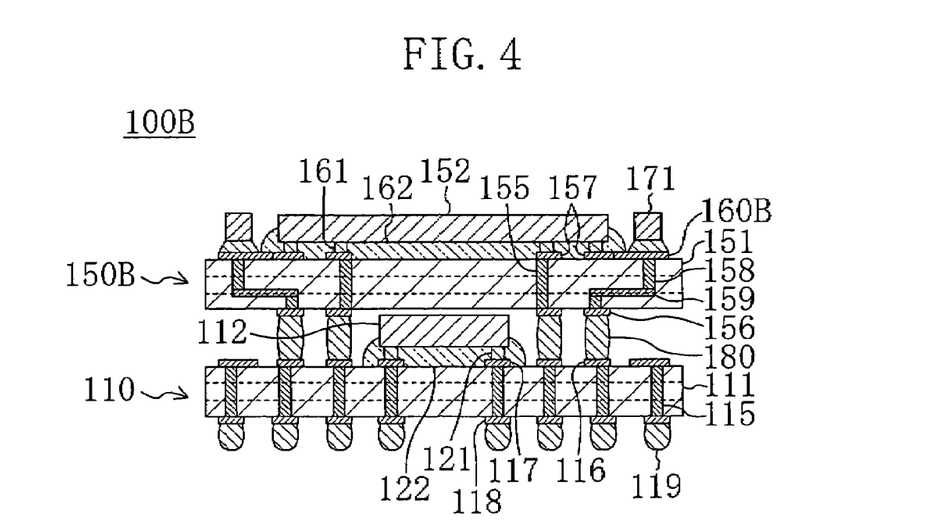
FIG. 4 is a sectional view of a stacked semiconductor module according to a second modification of the first embodiment.

FIG. 4 shows a cross-sectional structure of a stacked semiconductor module 100B according to a second modification of the first embodiment. The stacked semiconductor module 100B is characterized in that above the second semiconductor substrate 151 of the second semiconductor device 150B, not only the second semiconductor chip 152 but also electronic components 171 made of passive components are mounted to the region thereof surrounding the second semiconductor chip 152.

Following this, surface interconnects 160B of the second semiconductor substrate 151 also have a modified pattern arrangement from that of the stacked semiconductor module 100 shown in FIG. 1. Further, in order to mount the electronic components 171, the configuration of the interconnects in the second semiconductor substrate 151, the configuration of the interconnects in the first semiconductor substrate 111, and the like are also modified in part (not shown).

Mounting of the electronic components to the second semiconductor substrate 151 as shown above provides the same effects as the stacked semiconductor module 100. In addition to this, mounting of the electronic components 171 such as chip capacitors used for, for example, noise control can reduce the number of electronic components typically demanded to be mounted to a circuit board. Therefore, a more compact, slim stacked semiconductor module 100B with higher functionality can be fabricated.

In the first embodiment, both the first and second semiconductor chips 112 and 152 are mounted by a flip chip technique. Alternatively, they may be mounted by, for example, a wire bonding technique or a TAB technique. The first and second semiconductor chips 112 and 152 may be mounted by different mounting techniques.

Second Embodiment

Figure 5:
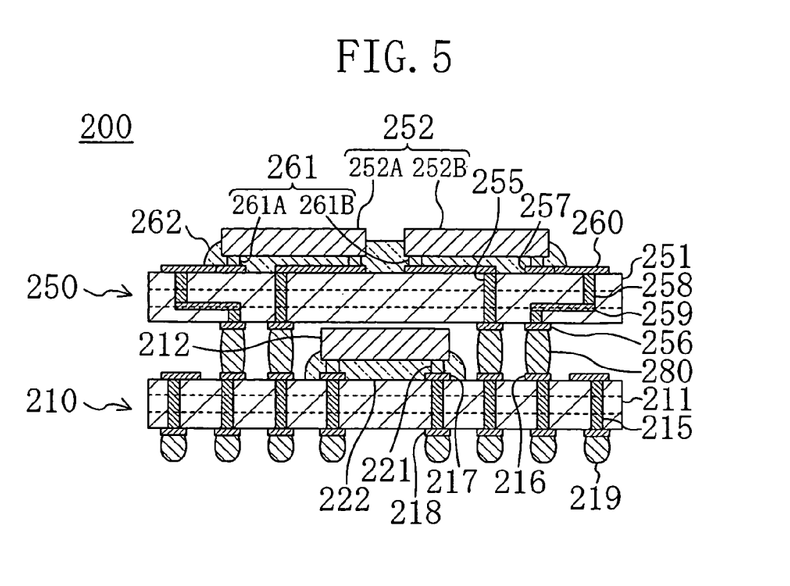
FIG. 5 is a sectional view of a stacked semiconductor module according to a second embodiment.
Figure 6:
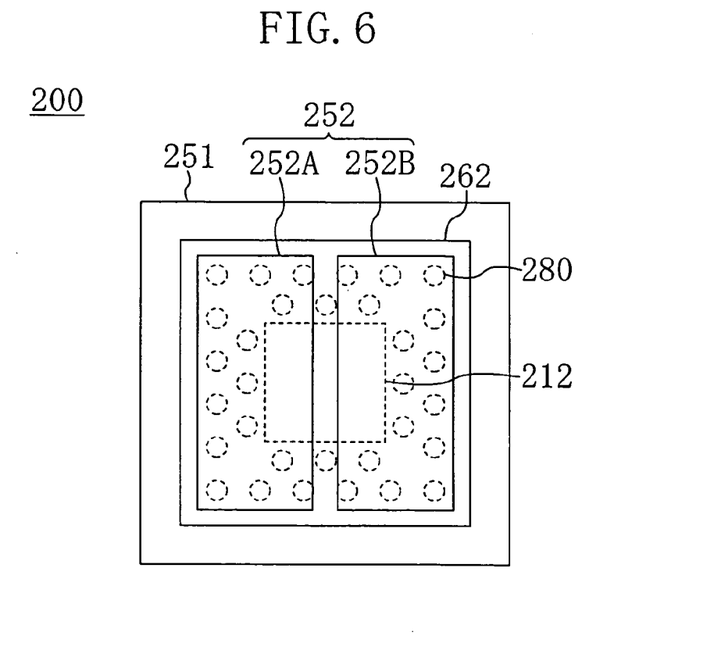
FIG. 6 is a plan view of the stacked semiconductor module of the second embodiment as viewed from a second semiconductor device.

FIG. 5 shows a cross-sectional structure of a stacked semiconductor module 200 according to a second embodiment of the present invention, and FIG. 6 shows a plan structure of the stacked semiconductor module 200.

The stacked semiconductor module 200 is designed so that a second semiconductor device 250 with a second semiconductor chip 252 mounted to the top surface of a second semiconductor substrate 251 is stacked above a first semiconductor device 210 with a first semiconductor chip 212 mounted to a first semiconductor substrate 211. The second embodiment is characterized in that the second semiconductor chip 252 is composed of a plurality of semiconductor chips disposed on the same plane.

In the first semiconductor substrate 211 having a multilayer interconnection structure, the center portion of the top surface thereof is provided with a region where the first semiconductor chip 212 is disposed. The inside of the first semiconductor substrate 211 is provided with a plurality of through conductors 215 extending from the top surface to the bottom surface. The top surface of the first semiconductor substrate 211 is provided with first connection terminals 216 for making connection to the second semiconductor device 250 and chip connection terminals 217 for making connection to the first semiconductor chip 212, and the first connection terminals 216 and the chip connection terminals 217 are connected to the top ends of the corresponding through conductors 215. The first connection terminals 216 are arranged in a grid array pattern in a region surrounding the first semiconductor chip 212. The bottom surface of the first semiconductor substrate 211 is provided with external connection terminals 218 for making connection to a circuit board in a grid array pattern, and the external connection terminals 218 are connected to the bottom ends of the corresponding through conductors 215. The bottom surfaces of the external connection terminals 218 are provided with external-connection protruding electrodes 219 for connecting the stacked semiconductor module 200 to a circuit board (not shown).

Like the first embodiment, the first connection terminals 216 and the chip connection terminals 217 provided on the top surface of the first semiconductor substrate 211 and the external connection terminals 218 provided on the bottom surface thereof may be connected by, instead of the through conductors 215, an interconnection pattern made of, for example, inner vias (not shown), inner interconnects (not shown), and surface interconnects (not shown). With this pattern, also in the interconnection pattern made of the first connection terminals 216, the chip connection terminals 217, and the external connection terminals 218, the first connection terminals 216 can be located at the midpoint of the pattern like the first embodiment. Therefore, the first connection terminal 216 can be checked for faulty electrical continuity simultaneously with an electrical test on the first semiconductor device 210, and thereby only the first semiconductor device 210 recognized as a conforming one can be stacked. As a result, a module with a stacked structure can be provided at a high yield.

As the base material for the first semiconductor substrate 211, use can be made of glass epoxy resin, polyimide resin, aramid resin, alumina ceramic, aluminum nitride ceramic, glass, quartz, or the like. However, as in the case of the first embodiment, the base material of resin is preferably used in that the resulting multilayer interconnection structure can be fabricated at a low cost. In addition, the shape and material of the external-connection protruding electrode 219 are also identical to those in the first embodiment.

On electrode terminals (not shown) arranged on the perimeter of the surface of the first semiconductor chip 212 where circuitry is formed, chip-connection protruding electrodes 221 are provided which are used for flip chip bonding to the chip connection terminals 217 of the first semiconductor substrate 211. Note that like the first embodiment, the first semiconductor chip 212 is made from a single-crystal silicon substrate, has circuitry formed by a known method, and is finished thinly by polishing or other methods. However, depending on the module structure, it may be used without polishing, or may be made from not a single-crystal silicon substrate but a compound semiconductor substrate, an SOI substrate, or the like. The material for the resin 222 for adhering and sealing a gap between the first semiconductor chip 212 and the first semiconductor substrate 211 is also identical to that in the first embodiment.

Like the first semiconductor substrate 211, the second semiconductor substrate 251 has a multilayer interconnection structure, the top surface thereof is provided with a region where the two second semiconductor chips 252 (252A and 252B) are disposed, and the inside thereof is provided with a plurality of through conductors 255 extending from the top surface to the bottom surface. The bottom surface of the second semiconductor substrate 251 is provided with second connection terminals 256 for making connection to the first semiconductor device 210, while the top surface thereof is provided with chip connection terminals 257 for making connection to the second semiconductor chips 252. The second connection terminal 256 and the chip connection terminal 257 are connected to the bottom and top ends of the through conductor 255, respectively. The second connection terminals 256 are provided in a region of the bottom surface of the second semiconductor substrate 251 lying, relative to the second semiconductor substrate 251, opposite to the region to which the second semiconductor chip 252 is mounted, and arranged in a grid array pattern in a region on the substrate corresponding to the perimeter region of the second semiconductor chip 252.

Note that the second connection terminals 256 provided on the bottom surface of the second semiconductor substrate 251 and the chip connection terminals 257 provided on the top surface thereof may be connected by, instead of the through conductors 255, an interconnection pattern made of, for example, inner vias 258, inner interconnects 259, and surface interconnects 260.

As the base material for the second semiconductor substrate 251, preferable use is made of the same base material as the first semiconductor substrate 211. By forming the semiconductor substrates using the same base material, the two substrates can have the same thermal expansion coefficient to minimize thermal stress applied thereto. This greatly improves the reliability as the semiconductor device.

The second embodiment is characterized in that the second semiconductor chip 252 is composed of two semiconductor chips, that is, the second semiconductor chips 252A and 252B, and these two semiconductor chips are arranged so that the narrowest gap therebetween is arranged in nearly the center region of the top surface of the second semiconductor substrate 251. Note that like the first semiconductor chip 212, the second semiconductor chip 252 is also formed by a known method.

The gap between the second semiconductor chip 252 and the second semiconductor substrate 251 and the gap between the second semiconductor chips 252A and 252B are adhered and sealed with resin 262 filling those gaps, and the second semiconductor chips 252A and 252B are arranged successively with the resin 262 interposed therebetween. In this structure, the total occupied area of the second semiconductor chips 252A and 252B is greater than the occupied area of the first semiconductor chip 212, and the second semiconductor substrate 251 has almost the same dimension as the first semiconductor substrate 211. Note that the material for the resin 262 is identical to the material of the resin 222 used in the first semiconductor device 210, and to the material used in the first embodiment.

In the second semiconductor chips 252A and 252B, the chip-connection protruding electrodes 261 (261A and 261B) for flip chip bonding to the chip connection terminals 257 of the second semiconductor substrate 251 are provided on electrode terminals (not shown) arranged on the perimeter of circuitry in the bottom surface of the second semiconductor chips 252A and 252B, respectively.

The fabrication method of the first semiconductor device 210 and the fabrication method of the second semiconductor device 250 using the components shown above are identical to those of the first embodiment. The method for constructing the stacked semiconductor module 200 in which the conductive connecting member 280 connects the first connection terminal 216 of the first semiconductor device 210 to the second connection terminal 256 of the second semiconductor device 250 is also identical to that of the first embodiment.

In the stacked semiconductor module 200 structured in the manner described above, as shown in FIGS. 5 and 6, the second connection terminals 256 are arranged in a grid array pattern on the region of the bottom surface of the second semiconductor substrate 251 lying, relative to the second semiconductor substrate 251, opposite to the region where the second semiconductor chips 252A and 252B are mounted flatly. Such a structure reduces bowing of the substrate, and thereby makes it difficult to cause, in stacking the second semiconductor device 250 above the first semiconductor device 210, poor connection therebetween. Moreover, even if the stacked semiconductor module 200 is subjected to temperature fluctuation, thermal stress applied can be made small. Therefore, faulty connection portion is difficult to create, so that a highly-reliable module can be fabricated.

In the second embodiment, description has been made of the example in which the second semiconductor chip 252 is composed of the two semiconductor chips, that is, one chip 252A and the other chip 252B. However, the present invention is not limited to the two semiconductor chips, and the second semiconductor chip 252 may be composed of three or more chips. Not only the second semiconductor chip 252 but also another electronic component may be mounted to the second semiconductor substrate 251.

Figure 7:
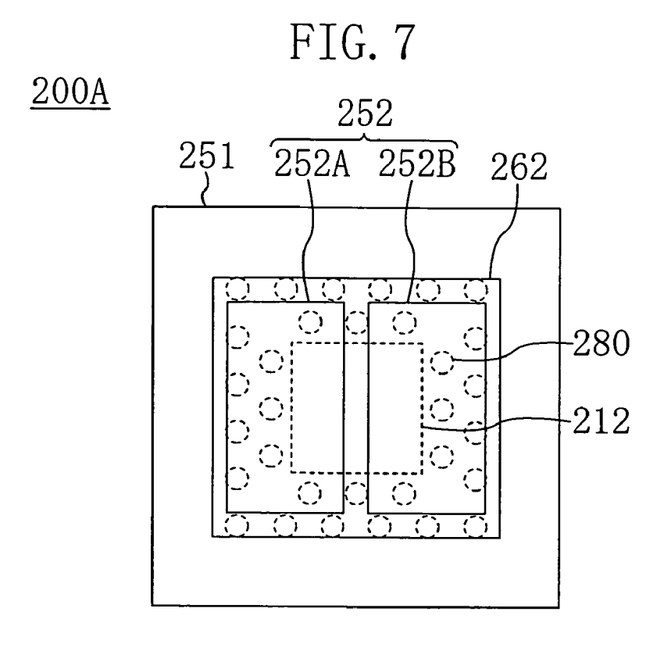
FIG. 7 is a plan view of a stacked semiconductor module according to a first modification of the second embodiment.

In the second embodiment, the conductive connecting members 280 are provided in the mounting region of the second semiconductor chip 252. Alternatively, as shown in FIG. 7, they may be provided in the region containing the resin 262. FIG. 7 shows a plan structure of a stacked semiconductor module 200A according to a first modification of the second embodiment. As can be seen from FIG. 7, some of the conductive connecting members 280 are provided to be positioned outside the region the second semiconductor chip 252 occupies, but the members positioned outside are still in the region where the resin 262 is formed with the second semiconductor substrate 251 interposed therebetween. Note that the second semiconductor substrate 251 has almost the same shape as the first semiconductor substrate 211 (not shown), and the stacked semiconductor module 200A has the same structure as the stacked semiconductor module 200 of the second embodiment except that the arrangement positions of the first and second connection terminals 216 and 256 differ resulting from the change of the arrangement positions of the conductive connecting members 280.

In the second embodiment, both the first and second semiconductor chips 212 and 252 are mounted by a flip chip technique. Alternatively, they may be mounted by, for example, a wire bonding technique or a TAB technique. The first and second semiconductor chips 212 and 252 may be mounted by different mounting techniques. In addition, the second semiconductor chips 252A and 252B may also be mounted by different mounting techniques.

Third Embodiment

Figure 8:
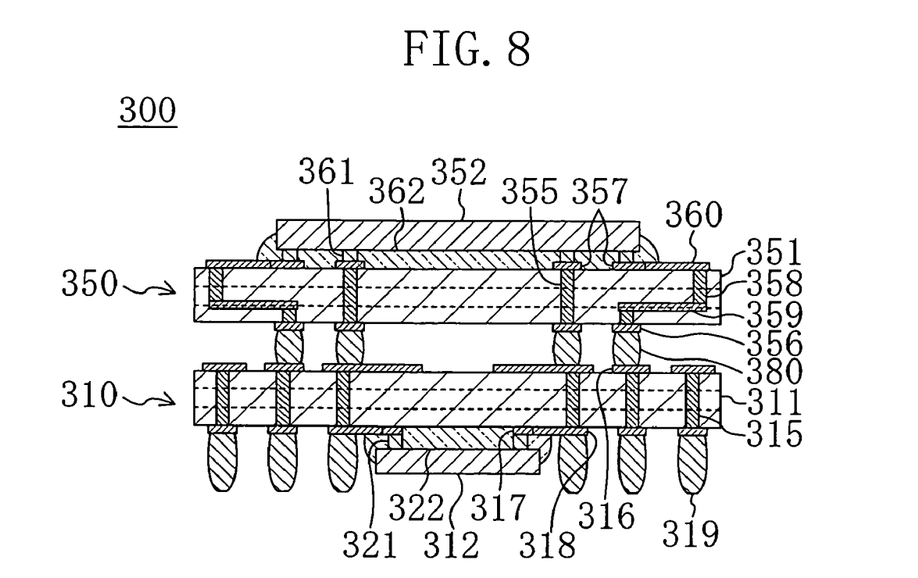
FIG. 8 is a sectional view of a stacked semiconductor module according to a third embodiment.

FIG. 8 shows a cross-sectional structure of a stacked semiconductor module 300 according to a third embodiment of the present invention.

The stacked semiconductor module 300 is designed so that a second semiconductor device 350 with a second semiconductor chip 352 mounted to the top surface of a second semiconductor substrate 351 is stacked above a first semiconductor device 310 with a first semiconductor chip 312 mounted to the bottom surface of a first semiconductor substrate 311. The third embodiment is characterized in that the first semiconductor chip 312 is disposed below the bottom surface of the first semiconductor substrate 311.

In the first semiconductor substrate 311 having a multi-layer interconnection structure, the center portion of the bottom surface thereof is provided with a region where the first semiconductor chip 312 is disposed. The inside of the first semiconductor substrate 311 is provided with a plurality of through conductors 315 extending from the top surface to the bottom surface. The top surface of the first semiconductor substrate 311 is provided with first connection terminals 316 for making connection to the second semiconductor device 350, and the first connection terminals 316 are connected to the top ends of the corresponding through conductors 315. The bottom surface of the first semiconductor substrate 311 is provided with chip connection terminals 317 for making connection to the first semiconductor chip 312 and external connection terminals 318 for making connection to a circuit board, and the chip connection terminals 317 and the external connection terminals 318 are connected to the bottom ends of the corresponding through conductors 315. The external connection terminals 318 are arranged in a grid array pattern in a region surrounding the first semiconductor chip 312. The bottom surfaces of the external connection terminals 318 are provided with external-connection protruding electrodes 319 for connecting the stacked semiconductor module 300 to a circuit board (not shown).

Like the first embodiment, of the first connection terminals 316 provided on the top surface of the first semiconductor substrate 311 and the chip connection terminals 317 and the external connection terminals 318 provided on the bottom surface thereof, terminals needed for the associated connections may be connected by, instead of the through conductors 315, an interconnection pattern made of, for example, inner vias (not shown), inner interconnects (not shown), and surface interconnects (not shown). With this pattern, like the first embodiment, an electrical test on the first semiconductor device 310 and check for faulty electrical continuity on the first connection terminal 316 can be made simultaneously, and thereby only the first semiconductor device 310 recognized as a conforming one can be stacked. As a result, a module with a stacked structure can be provided at a high yield.

Like the first semiconductor substrate 311, the second semiconductor substrate 351 has a multilayer interconnection structure, the top surface thereof is provided with a region where the second semiconductor chip 352 is disposed, and the inside thereof is provided with a plurality of through conductors 355 extending from the top surface to the bottom surface. The bottom surface of the second semiconductor substrate 351 is provided with second connection terminals 356 for making connection to the first semiconductor device 310, while the top surface thereof is provided with chip connection terminals 357 for making connection to the second semiconductor chips 352. The second connection terminal 356 and the chip connection terminal 357 are connected to the bottom and top ends of the through conductor 355, respectively. The second connection terminals 356 are provided in a region of the bottom surface of the second semiconductor substrate 351 lying, relative to the second semiconductor substrate 351, opposite to the region to which the second semiconductor chip 352 is mounted, and arranged in a grid array pattern in a region on the substrate corresponding to the perimeter region of the second semiconductor chip 352.

Note that the second connection terminals 356 provided on the bottom surface of the second semiconductor substrate 351 and the chip connection terminals 357 provided on the top surface thereof may be connected by, instead of the through conductors 355, an interconnection pattern made of, for example, inner vias 358, inner interconnects 359, and surface interconnects 360.

As in the case of the first embodiment, it is recommendable to use the same base material for the first and second semiconductor substrates 311 and 351. By forming the semiconductor substrates using the same base material, the two substrates can have the same thermal expansion coefficient to minimize thermal stress applied thereto. This greatly improves the reliability as the semiconductor device.

In the first and second semiconductor chips 312 and 352, chip-connection protruding electrodes 321 and chip-connection protruding electrodes 361 for flip chip bonding to the first and second semiconductor substrates 311 and 351 are provided on electrode terminals (not shown) arranged on the perimeter of the surface thereof where circuitry is formed, respectively. The gap between the first semiconductor chip 312 and the first semiconductor substrate 311 and the gap between the second semiconductor chip 352 and the second semiconductor substrate 351 are adhered and sealed with resins 322 and 362 filling those gaps, respectively, and the materials for the resins 322 and 362 are identical to the material used in the first embodiment.

The fabrication methods of the first semiconductor device 310 and the second semiconductor device 350 using the components shown above are identical to those of the first embodiment. The method for constructing the stacked semiconductor module 300 in which the conductive connecting member 380 connects the first connection terminal 316 of the first semiconductor device 310 to the second connection terminal 356 of the second semiconductor device 350 is also identical to that of the first embodiment.

In the stacked semiconductor module 300 structured in the manner described above, the conductive connecting member 380 is provided on the bottom surface of the second semiconductor substrate 351 opposed, relative to the second semiconductor substrate 351, to the region where the second semiconductor chip 352 is mounted, whereby bowing of the substrates is reduced. This makes it difficult to cause poor connection in stacking the second semiconductor device 350 above the first semiconductor device 310. Moreover, even if the stacked semiconductor module 300 is subjected to temperature fluctuation, thermal stress applied to the connection portions is small. Therefore, faulty connection portion is difficult to cerate, so that a highly-reliable module can be fabricated.

The first semiconductor chip 312 is mounted to be flush with the external connection terminals 318 of the first semiconductor substrate 311, and is not mounted to the surface connected to the second semiconductor device 350. Therefore, the fabrication steps of stacking the second semiconductor device 350 on the first semiconductor device 310 by the conductive connecting member 380 can be carried out easily. Moreover, constraints on the position of arrangement of the first connection terminals b are eliminated, so that the design flexibility can be enhanced significantly.

Not only the second semiconductor chip 352 but also another electronic component may be mounted to the second semiconductor substrate 351 of the second semiconductor device 350. This enables fabrication of the stacked semiconductor module 300 with a higher functionality. The second semiconductor chip 352 may be composed of a plurality of semiconductor chips.

In the third embodiment, both the first and second semiconductor chips 312 and 352 are mounted by a flip chip technique. Alternatively, they may be mounted by, for example, a wire bonding technique or a TAB technique. The first and second semiconductor chips 312 and 352 may be mounted by different mounting techniques.

Fourth Embodiment

Figure 9:
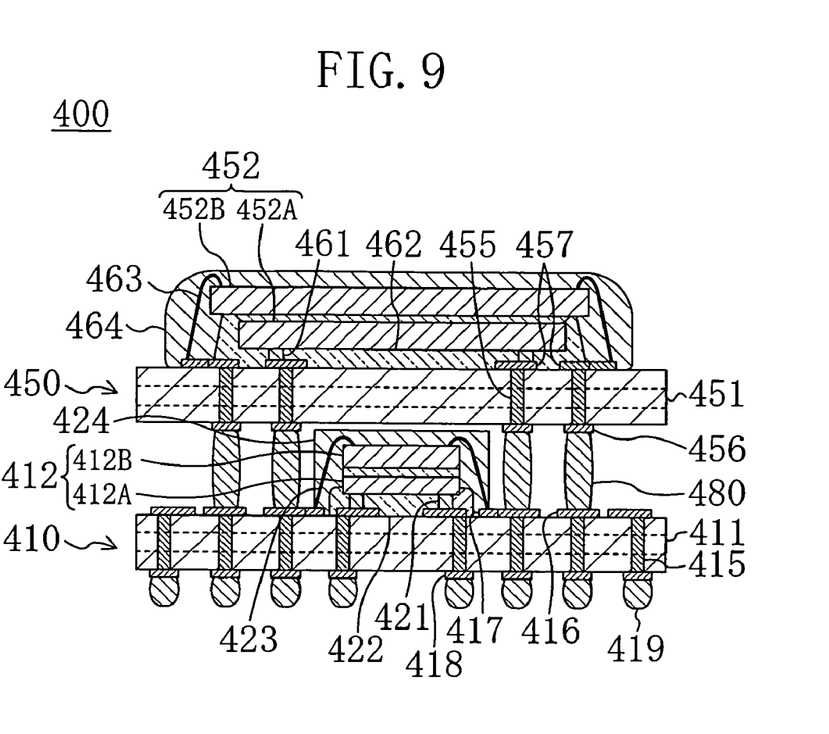
FIG. 9 is a sectional view of a stacked semiconductor module according to a fourth embodiment.

FIG. 9 shows a cross-sectional structure of a stacked semiconductor module 400 according to a fourth embodiment of the present invention. The stacked semiconductor module 400 is designed so that a second semiconductor device 450 with a second semiconductor chip 452 mounted to the top surface of a second semiconductor substrate 451 is stacked above a first semiconductor device 410 with a first semiconductor chip 412 mounted to a first semiconductor substrate 411. The fourth embodiment is characterized in that the second semiconductor chip 452 having a plurality of semiconductor chips stacked therein is mounted to the second semiconductor substrate 451 and concurrently that the first semiconductor chip 412 also having a plurality of semiconductor chips stacked therein is mounted to the first semiconductor substrate 411.

In the first semiconductor substrate 411 having a multilayer interconnection structure, the top surface thereof is provided with a region where the first semiconductor chip 412 is disposed. The inside of the first semiconductor substrate 411 is provided with a plurality of through conductors 415 extending from the top surface to the bottom surface. The top surface of the first semiconductor substrate 411 is provided with first connection terminals 416 for making connection to the second semiconductor device 450 and chip connection terminals 417 for making connection to the first semiconductor chip 412, and the first connection terminals 416 and the chip connection terminals 417 are connected to the top ends of the corresponding through conductors 415. The first connection terminals 416 are arranged in a grid array pattern in a region surrounding the first semiconductor chip 412. The bottom surface of the first semiconductor substrate 411 is provided with external connection terminals 418 for making connection to a circuit board (not shown) in a grid array pattern, and the external connection terminals 418 are connected to the bottom ends of the corresponding through conductors 415. The bottom surfaces of the external connection terminals 418 are provided with external-connection protruding electrodes 419 for connecting the stacked semiconductor module 400 to a circuit board (not shown).

Like the first embodiment, the first connection terminals 416 and the chip connection terminals 417 provided on the top surface of the first semiconductor substrate 411 and the external connection terminals 418 provided on the bottom surface thereof may be connected by, instead of the through conductors 415, an interconnection pattern made of, for example, inner vias (not shown), inner interconnects (not shown), and surface interconnects (not shown). With this pattern, also in the interconnection pattern made of the first connection terminals 416, the chip connection terminals 417, and the external connection terminals 418, the first connection terminals 416 can be located at the midpoint of the pattern like the first embodiment. Therefore, the first connection terminal 416 can be checked for faulty electrical continuity simultaneously with an electrical test on the first semiconductor device 410, and thereby only the first semiconductor device 410 recognized as a conforming one can be stacked. As a result, a module with a stacked structure can be provided at a high yield.

In the fourth embodiment, the first semiconductor chip 412 is composed of two semiconductor chips, that is, a first semiconductor chip 412A and a first semiconductor chip 412B, and stacking of these two semiconductor chips above the top surface of the first semiconductor substrate 411 is one of the characteristics of this embodiment. On electrode terminals (not shown) arranged on the perimeter of circuitry on the bottom surface of the first semiconductor chip 412A, chip-connection protruding electrodes 421 are formed which are used for flip chip bonding of the first semiconductor chip 412A to the chip connection terminals 417 on the top surface of the first semiconductor substrate 411. The first semiconductor substrate 411 and the first semiconductor chip 412A are adhered and sealed with a resin 422 filling a gap therebetween. In the first semiconductor chip 412A and the first semiconductor chip 412B, the first semiconductor chip 412B is fixedly adhered with adhesive above the first semiconductor chip 412A. The chip connection terminals 417 of the first semiconductor substrate 411 and electrode terminals (not shown) of the first semiconductor chip 412B are connected by wire leads 423 through a wire bonding technique, and protecting resin 424 is provided which is used for protecting the first semiconductor chip 412B and the wire leads 423.

Like the first semiconductor substrate 411, the second semiconductor substrate 451 has a multilayer interconnection structure, the top surface thereof is provided with a region where the second semiconductor chip 452 is disposed, and the inside thereof is provided with a plurality of through conductors 455 extending from the top surface to the bottom surface. The bottom surface of the second semiconductor substrate 451 is provided with second connection terminals 456 for making connection to the first semiconductor device 410, while the top surface thereof is provided with chip connection terminals 457 for making connection to the second semiconductor chips 452. The second connection terminal 456 and the chip connection terminal 457 are connected to the bottom and top surfaces of the through conductor 455, respectively. The second connection terminals 456 are provided in a region of the bottom surface of the second semiconductor substrate 451 lying, relative to the second semiconductor substrate 451, opposite to the region to which the second semiconductor chip 452 is mounted, and arranged in a grid array pattern in a region on the substrate corresponding to the perimeter region of the second semiconductor chip 452.

Although not shown, the second connection terminals 456 provided on the bottom surface of the second semiconductor substrate 451 and the chip connection terminals 457 provided on the top surface thereof may be connected by, instead of the through conductors 455, an interconnection pattern made of, for example, inner vias (not shown), inner interconnects (not shown), and surface interconnects (not shown). This alternative is identical to the first embodiment.

The fourth embodiment is characterized in that the second semiconductor chip 452 is composed of two semiconductor chips, that is, the second semiconductor chips 452A and 452B, and the two semiconductor chips are stacked above the top surface of the second semiconductor substrate 451. On electrode terminals (not shown) arranged on the perimeter of circuitry on the bottom surface of the second semiconductor chip 452A, chip-connection protruding electrodes 461 are formed which are used for flip chip bonding of the second semiconductor chip 452A to the chip connection terminal 457 provided on the top surface of the second semiconductor substrate 451. The second semiconductor substrate 451 and the second semiconductor chips 452A are adhered and sealed with a resin 462 filling a gap therebetween. In the second semiconductor chips 452A and 452B, the second semiconductor chip 452B is fixedly adhered with adhesive above the second semiconductor chip 452A. The chip connection terminals 457 of the second semiconductor substrate 451 and electrode terminals (not shown) of the second semiconductor chip 452B are connected by wire leads 463 through a wire bonding technique, and protecting resin 464 is provided which is used for protecting the first semiconductor chip 452B and the wire leads 463. Not only the second semiconductor chip 452 but also another electronic component may be mounted to the second semiconductor substrate 451.

In the fourth embodiment, as shown in FIG. 9, the second semiconductor chip 452B stacked above the second semiconductor chip 452A is set to have a larger shape than the second semiconductor chip 452A. Alternatively, the second semiconductor chip 452A may have a larger shape, and it is necessary for at least either of the second semiconductor chips 452A and 452B to have a larger area than the area occupied by the first semiconductor chip 412. However, if the second semiconductor chips 452A and 452B do not have the same shape, the region corresponding to the bigger one of the second semiconductor chips 452A and 452B is used as the mounting region of the second semiconductor chip 452, and the second connection terminal 456 may be provided in a grid array pattern on the region lying, relative to the second semiconductor substrate 451, opposite to the region surrounding that mounting region.

As the base material for the first semiconductor substrate 411 and the second semiconductor substrate 451, use can be made of glass epoxy resin, polyimide resin, aramid resin, alumina ceramic, aluminum nitride ceramic, glass, quartz, or the like. However, the base material of resin is preferably used in that the resulting multilayer interconnection structure can be fabricated at a low cost. Further, by forming the first semiconductor substrate 411 and the second semiconductor substrate 451 using the same base material, the two substrates can have the same thermal expansion coefficient to minimize thermal stress applied thereto. This greatly improves the reliability as the semiconductor device.

The first semiconductor chips 412A and 412B do not have to be semiconductor elements formed on the same single-crystal silicon substrate, and alternatively one of the chips may use a silicon substrate and the other of the chips may use a compound semiconductor substrate. Still alternatively, an SOI substrate may be used. This alternative is identical to the second semiconductor chips 452A and 452B.

The fabrication method of the first semiconductor device 410 and the fabrication method of the second semiconductor device 450 using the components shown above are identical to those of the first embodiment. The method for constructing the stacked semiconductor module 400 in which the conductive connecting member 480 connects the first connection terminal 416 of the first semiconductor device 410 to the second connection terminal 456 of the second semiconductor device 450 is also identical to that of the first embodiment. The material and the connection method of the conductive connecting member 480 are also identical to those of the first embodiment.

In the stacked semiconductor module 400 structured in the manner described above, the first semiconductor chip 412 mounted to the first semiconductor substrate 411 and the second semiconductor chip 452 mounted to the second semiconductor substrate 451 are made by stacking the two semiconductor chips, respectively. Thereby, a highly-reliable module can be fabricated. Moreover, even if such a structure is employed, it becomes difficult to cause, in connecting the first semiconductor device 410 to the second semiconductor device 450 by the conductive connecting member 480, poor connection therebetween resulting from possible bowing. Moreover, even if the stacked semiconductor module 400 is subjected to temperature fluctuation, thermal stress generated in the connection portion can be made small. Therefore, faulty connection portion is difficult to create, so that a highly-reliable module can be fabricated.

In the fourth embodiment, in both the first and second semiconductor chips 412 and 452, the respective semiconductor chip stacked at the lower position is mounted by a flip chip technique, while the respective semiconductor chip stacked at the higher position is mounted by a wire bonding technique. However, the present invention is not limited to this, and the respective semiconductor chip at the lower position may be mounted by a flip chip technique and the respective semiconductor chip at the higher position may be mounted by a TAB technique. Alternatively, both of the semiconductor chips at higher and lower positions may be mounted by a TAB technique. The first and second semiconductor chips 412 and 452 may be mounted by different mounting techniques.

As described above, the stacked semiconductor module of the present invention can reduce bowing resulting from thermal stress generated in stacking the two semiconductor devices or mounting the stacked semiconductor module to the circuit board, and thereby prevent poor connection. Moreover, even if the module is subjected to temperature fluctuation, faulty connection portion due to thermal stress is difficult to create. Therefore, a highly-reliable module can be fabricated. Accordingly, the stacked semiconductor module of the present invention is useful in the field of electronic equipment such as a cellular phone and a digital camera.

What is claimed is:

1. A stacked semiconductor module,
   wherein the module is made by stacking a second semiconductor device above a first semiconductor device, the second semiconductor device having a second semiconductor chip mounted to a top surface of a second semiconductor substrate, the first semiconductor device having a first semiconductor chip mounted to a first semiconductor substrate,
   a top surface of the first semiconductor substrate is provided with a first connection terminal,
   a bottom surface of the second semiconductor substrate is provided with a second connection terminal,
   a first conductive connecting member connects the first connection terminal to the second connection terminal,
   an underfill resin fills between the second semiconductor substrate and the second semiconductor chip, and
   said stacked semiconductor module is arrange such that a first outer periphery of a first region in which the underfill resin is formed surrounds, in plan view, a second outer periphery of a second region in which the second semiconductor chip is held, thereby forming a middle region between said first and second outer periphery,
   wherein at least a portion of said first conductive connecting member is formed, in plan view, in said middle region.

2. The module of claim 1, wherein the first semiconductor chip is mounted to a center portion of the first semiconductor substrate.

3. The module of claim 1, wherein a region where the second semiconductor chip is mounted is larger than a region where the first semiconductor chip is mounted.

4. The module of claim 1, wherein the second semiconductor chip is composed of a plurality of semiconductor chips arranged on the same plane.

5. The module of claim 1, wherein the second semiconductor chip is composed of a plurality of semiconductor chips in a stacked arrangement.

6. The module of claim 1, wherein the first conductive connecting member is formed in a region under the second semiconductor chip.

7. The module of claim 1, further comprising a second conductive connecting member formed, in plan view, inside the second region.

8. The module of claim 1, further comprising a plurality of said first conductive connecting members and a plurality of second conductive connecting member, each of said plurality of first and second conductive connecting members are formed, in plan view, inside the first region.

9. The module of claim 1, further comprising a substrate interconnect formed in and/or on the first semiconductor substrate and/or the second semiconductor substrate.

* * * * *

UNITED STATES PATENT AND TRADEMARK OFFICE
CERTIFICATE OF CORRECTION

PATENT NO.       : 7,667,313 B2
APPLICATION NO. : 11/491033
DATED            : February 23, 2010
INVENTOR(S)      : Kawabata et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 321 days.

Signed and Sealed this

Seventh Day of December, 2010

David J. Kappos
*Director of the United States Patent and Trademark Office*